United States Patent
Placke et al.

(10) Patent No.: US 12,021,062 B2
(45) Date of Patent: Jun. 25, 2024

(54) EDGE INTERFACE PLACEMENTS TO ENABLE CHIPLET ROTATION INTO MULTI-CHIPLET CLUSTER

(71) Applicant: Micron Technology, Inc., Boise, ID (US)

(72) Inventors: Michael G. Placke, McKinney, TX (US); Tony Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 624 days.

(21) Appl. No.: 17/075,117

(22) Filed: Oct. 20, 2020

(65) Prior Publication Data

US 2024/0170453 A1    May 23, 2024

(51) Int. Cl.
*H01L 25/065* (2023.01)
*H01L 23/00* (2006.01)

(52) U.S. Cl.
CPC .......... *H01L 25/0655* (2013.01); *H01L 24/16* (2013.01)

(58) Field of Classification Search
None
See application file for complete search history.

(56) References Cited

U.S. PATENT DOCUMENTS

| | | |
|---|---|---|
| 8,952,510 B2 | 2/2015 | Cho et al. |
| 10,090,236 B2 | 10/2018 | Jayasena et al. |
| 2014/0048947 A1* | 2/2014 | Lee ..................... H01L 23/5384 257/777 |
| 2016/0240497 A1* | 8/2016 | Chen .................... H01L 25/0655 |
| 2019/0243700 A1* | 8/2019 | Brewer ................ G11C 7/1045 |
| 2020/0219846 A1 | 7/2020 | Ji et al. |

FOREIGN PATENT DOCUMENTS

| | | |
|---|---|---|
| WO | 2022119635 | 6/2022 |
| WO | 2022119635 | 9/2022 |

OTHER PUBLICATIONS

"International Application Serial No. PCT US2021 053760, International Search Report dated Aug. 5, 2022", 3 pages.
"International Application Serial No. PCT US2021 053760, Written Opinion dated Aug. 5, 2022", 5 pages.
"International Application Serial No. PCT US2021 053760, International Preliminary Report on Patentability dated May 4, 2023", 7 pages.

* cited by examiner

*Primary Examiner* — Hung K Vu
(74) *Attorney, Agent, or Firm* — Schwegman Lundberg & Woessner, P.A.

(57) ABSTRACT

A chiplet-based system comprises a substrate including conductive interconnect and multiple chiplets arranged on the interposer and interconnected using the conductive interconnect of the substrate. A chiplet includes multiple columns of multiple input-output (I/O) channels and the I/O channels are connected to a block of I/O pads and each side of the chiplet includes multiple blocks of the I/O pads. The multiple blocks of I/O pads on the side of the chiplet are arranged symmetrically relative to a centerline of the chiplet and each block of I/O pads on the side of the chiplet is at a common distance from any adjacent block of I/O pads on the side.

15 Claims, 6 Drawing Sheets

EDGE INTERFACE PLACEMENTS TO ENABLE CHIPLET ROTATION INTO MULTI-CHIPLET CLUSTER

GOVERNMENT RIGHTS

This invention was made with U.S. Government support under Agreement No. HR00111890003, awarded by DARPA. The U.S. Government has certain rights in the invention.

TECHNICAL FIELD

Embodiments of the disclosure relate generally to chiplet-based systems and more specifically to a chiplet architecture that reduces the footprint of chiplet-based systems.

BACKGROUND

Chiplets are an emerging technique for integrating various processing functionality. Generally, a chiplet system is made up of discreet chips (e.g., integrated circuits (ICs) on different substrate or die) that can be integrated on an interposer and packaged together. This arrangement is distinct from single chips (e.g., ICs) that contain distinct device blocks (e.g., intellectual property (IP) blocks) on one substrate (e.g., single die), such as a system-on-a-chip (SoC), or discreetly packaged devices integrated on a board. In general, chiplets provide better performance (e.g., lower power consumption, reduced latency, etc.) than discreetly packaged devices, and chiplets provide greater production benefits than single die chips. These production benefits can include higher yields or reduced development costs and time.

Chiplet systems are generally made up of one or more application chiplets and support chiplets. Here, the distinction between application and support chiplets is simply a reference to the likely design scenarios for the chiplet system. Thus, for example, a synthetic vision chiplet system can include an application chiplet to produce the synthetic vision output along with support chiplets, such as a memory controller chiplet, sensor interface chiplet, or communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those using different feature sizes. Thus, for example, devices designed during a previous fabrication generation with larger feature sizes, or those devices in which the feature size is optimized for the power, speed, or heat generation (e.g., for sensor applications) can be integrated with devices having different feature sizes more easily than attempting to do so on a single die. Additionally, by reducing the overall size of the die, the yield for chiplets tends to be higher than that of more complex, single die devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, various embodiments discussed in the present document.

DETAILED DESCRIPTION

Embodiments of the present disclosure are directed to initializing electronic systems that include chiplets. The system may include chiplets that each perform a different function, or the chiplets may perform the same function, but configuring multiple chiplets together (e.g., to implement parallelism of the function) results in a higher performance solution. The chiplets may be arranged in a tightly packed matrix to create a higher performance functional block in a minimum footprint. Within the context of a chiplet system an issue can arise in aligning input-output (I/O) between the chiplets.

Figure 1A:
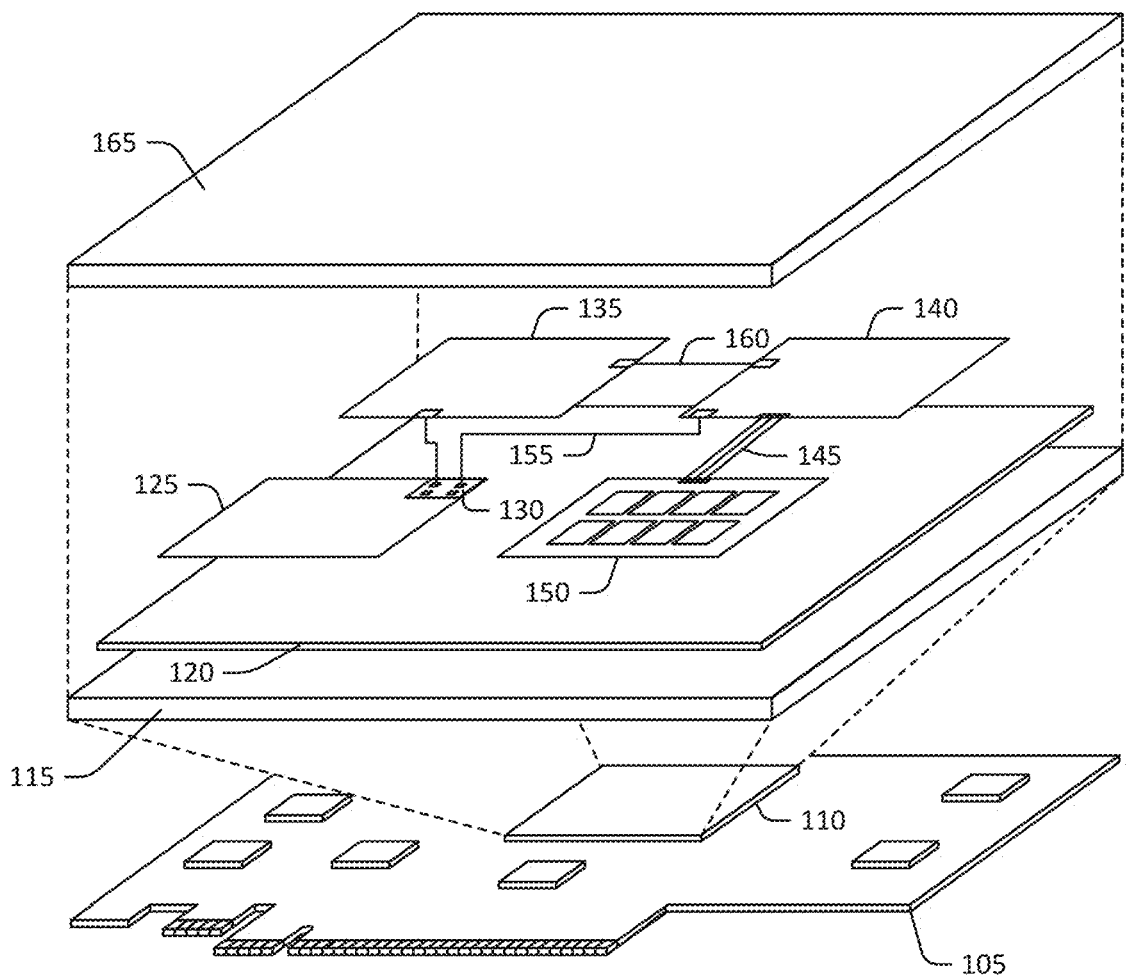
FIGS. 1A-1B illustrate an example of a chiplet system, in accordance with some examples described herein.
Figure 1B:
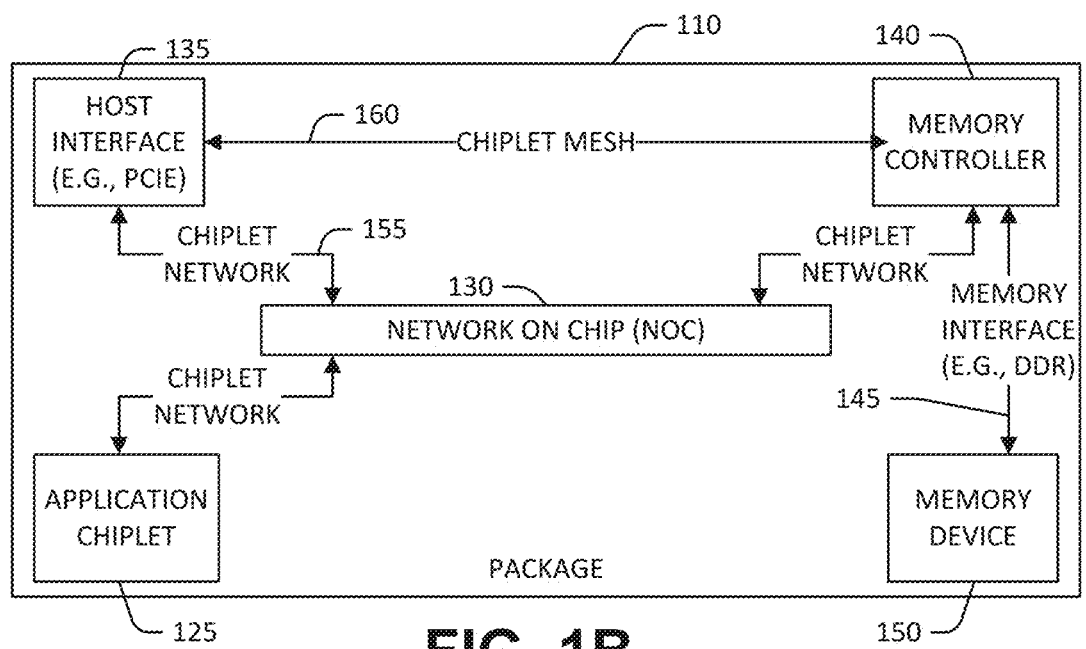

FIGS. 1A and 1B illustrate an example of a chiplet system 110. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets; an application chiplet 125, a host interface chiplet 135, a memory controller chiplet 140, and a memory device chiplet 150. Instead of an interposer 120, the chiplets may be mounted on a on a system substrate that is not an interposer such as a silicon substrate or an organic substrate. The package of the chiplet system 110 is illustrated with a lid 165, though other covering techniques for the package can be used. FIG. 1B is a block diagram labeling the components in the chiplet system for clarity.

The application chiplet 125 is illustrated as including a network-on-chip (NOC) 130 to support an inter-chiplet communications network, or chiplet network 155. The NOC 130 is generally included on the application chiplet 125 because it is usually created after the support chiplets (e.g., chiplets 135, 140, and 150) are selected, thus enabling a designer to select an appropriate number of chiplet network connections or switches for the NOC 130. In an example, the NOC 130 can be located on a separate chiplet, or even within the interposer 120. In an example, the NOC 130 implements a chiplet protocol interface (CPI) network.

A CPI network is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. To achieve the flexibility of the chiplet system, CPI is used as an adapter to interface between the various AXI design options that can be used across the various chiplets. By enabling a physical channel to virtual channel mapping and encapsulating time-based signaling with a packetized protocol, CPI successfully bridges intra-chiplet networks across the chiplet network 155.

CPI can use a variety of different physical layers to transmit packets. The physical layer can include simple conductive connections or include drivers to transmit the signals over longer distances or drive greater loads. An example of one such physical layer can include the Advanced Interface Bus (AIB), implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60 . . . .), and 40 bits for DDR mode: (40, 80, 120 . . . .). The AIB channel width includes both transmit and receive signals. The channel can be configured to have a symmetrical number of transmit (TX) and receive (RX) I/Os. or have a non-symmetrical number of transmitters and receivers (e.g., either all transmitters or all receivers). The AIB channel can act as an AIB principal (governing) channel or subordinate (responsive) channel depending on which chiplet provides the data transfer clock. AIB I/O cells support three clocking modes: asynchronous (i.e. non-clocked). SDR, and DDR. The non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half RX and half RX. CPI packet protocols can use an AIB channel in either SDR or DDR operation modes. In an example, the AIB channel is configurable in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The interface identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIR physical layer transmits the interface identifier using an AIR out-of-band shift register. The 20-bit interface identifier is transferred in both directions across an AIR interface using bits 32-51 of the shift registers.

AIR defines a stacked set of AIB channels as an AIB channel column. An AIR channel column has some number of AIB channels, plus an auxiliary channel that can be used for out-of-band signaling. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

In general, CPI interfaces of individual chiplets can include serialization-deserialization (SERDES) hardware. SERDES interconnects work well for scenarios in which high-speed signaling with low signal count are desirable. However, SERDES can result in additional power consumption and longer latencies for multiplexing and demultiplexing, error detection or correction (e.g., using block level cyclic redundancy checking (CRC)), link-level retry, or forward error correction. For ultra-short reach chiplet-to-chiplet interconnects where low latency or energy consumption is a primary concern, a parallel interface with clock rates that allow data transfer with minimal latency can be a better solution. CPI includes elements to minimize both latency and energy consumption in these ultra-short reach chiplet interconnects.

Also illustrated in FIGS. 1A and 1B is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as the memory interface 145, can also be used to interconnect chiplets, or to connect chiplets to external devices; such as the host interface chiplet 135 providing a PCIE interface external to the board 105 for the application chiplet 125. Such dedicated interfaces 145 are generally used when a convention or standard in the industry has converged on such an interface. The illustrated example of a Double Data Rate (DDR) interface 145 connecting the memory controller chiplet 140 to a dynamic random access memory (DRAM) memory device chiplet 150 is an example of such an industry convention.

The memory device chiplet 150 can be, or can include, any combination of volatile memory devices or non-volatile memories. Examples of volatile memory devices include, but are not limited to, random access memory (RAM), dynamic RAM (DRAM), synchronous DRAM (SDRAM), and graphics double data rate type 6 SDRAM (GDDR6 SDRAM). Examples of non-volatile memory devices include, but are not limited to, negative-and-(NAND)-type flash memory, storage class memory (e.g., phase-change memory or memristor based technologies), and ferroelectric RAM (FeRAM). The illustrated example of FIGS. 1A and 1B includes the memory device 150 as a chiplet, however, the memory device 150 can reside elsewhere, such as in a different package on the board 105.

As shown in FIG. 1A, a chiplet system 110 may include many chiplets and the chiplets may be arranged in a tightly packed matrix to create a higher performance functional block in a minimum footprint. Each of the chiplets may include multiple blocks of I/O pads at the edges of the chiplet. To reduce the footprint, the blocks of I/O pads can be blocks of I/O micro-bumps. The interposer 120 may be a silicon interposer included in a chip on wafer substrate package. In certain examples, the interposer 120 is an organic substrate such as a substrate made from organic polymers. In certain examples, the interposer 120 includes an embedded multi-die interconnect bridge (EMIB). In certain examples, the chiplet system does not include an interposer and the chiplets are mounted directly onto a substrate that includes the interconnect for the chiplets. The substrate may be a silicon substrate or an organic substrate.

The interposer interconnect between chiplets should be close-coupled. This can be done by placing the blocks of 10 micro bumps at the edges of the chiplets to minimize the interconnect distance. The chiplets may have multiple interfaces on a side or may have an interface that includes multiple I/O micro-bump blocks. The interface block or blocks of one chiplet need to be properly aligned to the correct interface block or blocks of another chiplet to make a correct interface connection.

Figure 2:
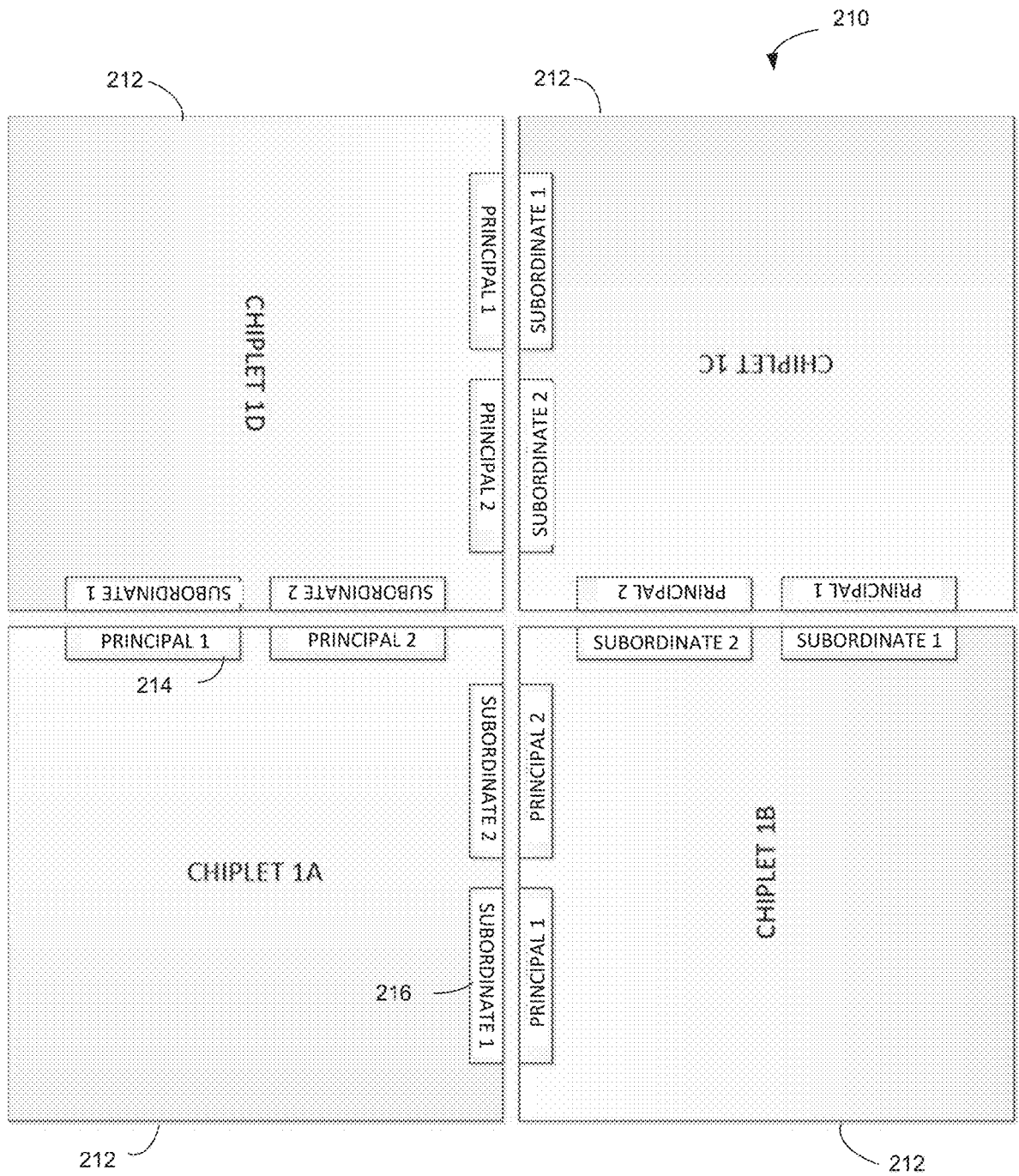
FIG. 2 is a block diagram of an example of a memory controller chiplet, in accordance with some examples described herein.

FIG. 2 is an illustration representing a chiplet-based system 210 arranged in a tightly spaced matrix. The example shows four chiplets 212 and the chiplets may be the application chiplet, host interface chiplet, memory controller chiplet, and memory device chiplet in the example of FIG. 1A. Each chiplet includes multiple columns of I/O channels (e.g., AIB I/O channels). The columns are connected to blocks of I/O pads located at the periphery or edge of the sides of the chiplets. In the example of FIG. 2, each chiplet includes two blocks of I/O pads on two sides of each of the chiplets. In an actual implementation, a chiplet may include many blocks of I/O pads. A chiplet may include blocks of I/O pads on more than two sides. For example, a central chiplet may include blocks of I/O on all four sides with other chiplets arranged around the central chiplet.

The blocks of I/O pads may be I/O micro-bump blocks. This allows for close-coupled interconnects for the chiplets to provide large parallel interfaces. The interfaces are connected using a die-to-die physical layer. The chiplet may have different types of interfaces, and the interfaces may need to be rotated to for proper alignment and connection to the adjacent chiplet.

In the example of FIG. 2, each chiplet 212 includes two types of I/O columns; I/O columns including principal channels 214 and I/O columns including subordinate channels 216 responsive to the principal channels. The channels may be AIB principal and subordinate channel interfaces. Each chiplet includes the subordinate channel interfaces in the same relation to the principal channel interfaces. If the chiplet is oriented with the side of the chiplet including the principal channels 214 at the top (or north), the side of the chiplet with the subordinate channels 216 will be to the right (or east). Thus, some of the chiplets need to be rotated for proper alignment of the I/O pads of the principal and secondary channel interfaces so that the two blocks of principal I/O (labeled PRINCIPAL 1 and PRINCIPAL 2) are correctly connected to the related blocks of slave I/O (labeled SUBORDINATE 1 and SUBORDINATE 2).

The placement of the blocks of I/O pads facilitates rotating. The blocks of the I/O pads on the side of the chiplet are arranged symmetrically relative to a centerline of the chiplet. Each block of I/O pads on the side of the chiplet is at a common distance from any adjacent block of I/O pads on the side.

Figure 3:
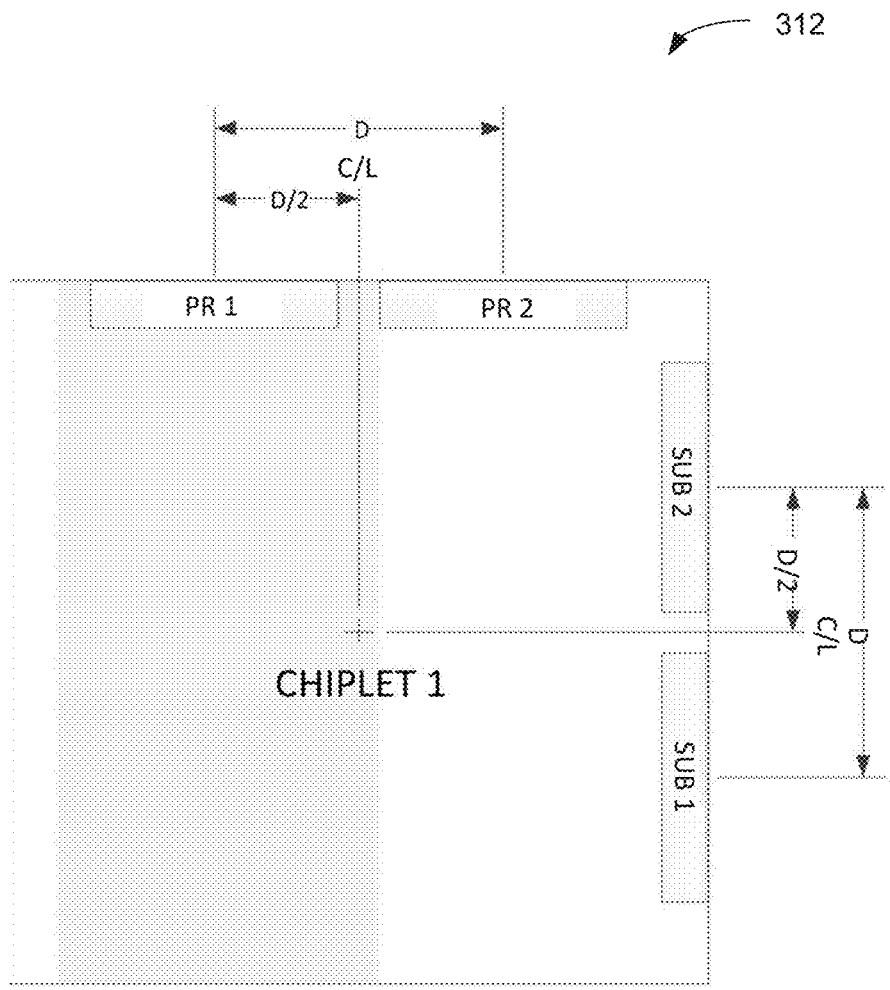
FIG. 3 is an illustration representing a chiplet system arranged in a tightly spaced matrix, in accordance with some examples described herein.

FIG. 3 is an illustration representing an example of a chiplet 312 having an even number (two) of blocks of I/O pads on a side. Each block of I/O pads is placed at a distance from the centerline (C/L) of the chiplet equal to one-half of the total distance (D) between blocks on each side. The example in FIG. 3 shows that if all the chiplets start oriented the same as chiplet IA, each of the other chiplets is turned a different number of turns to arrive at the correct orientation relative to the other chiplets. While in the example, this is shown for the case of two blocks of I/O pads on a side, the concept can be expanded to having any even number of blocks on a side such as four or more blocks on a side.

Figure 4:
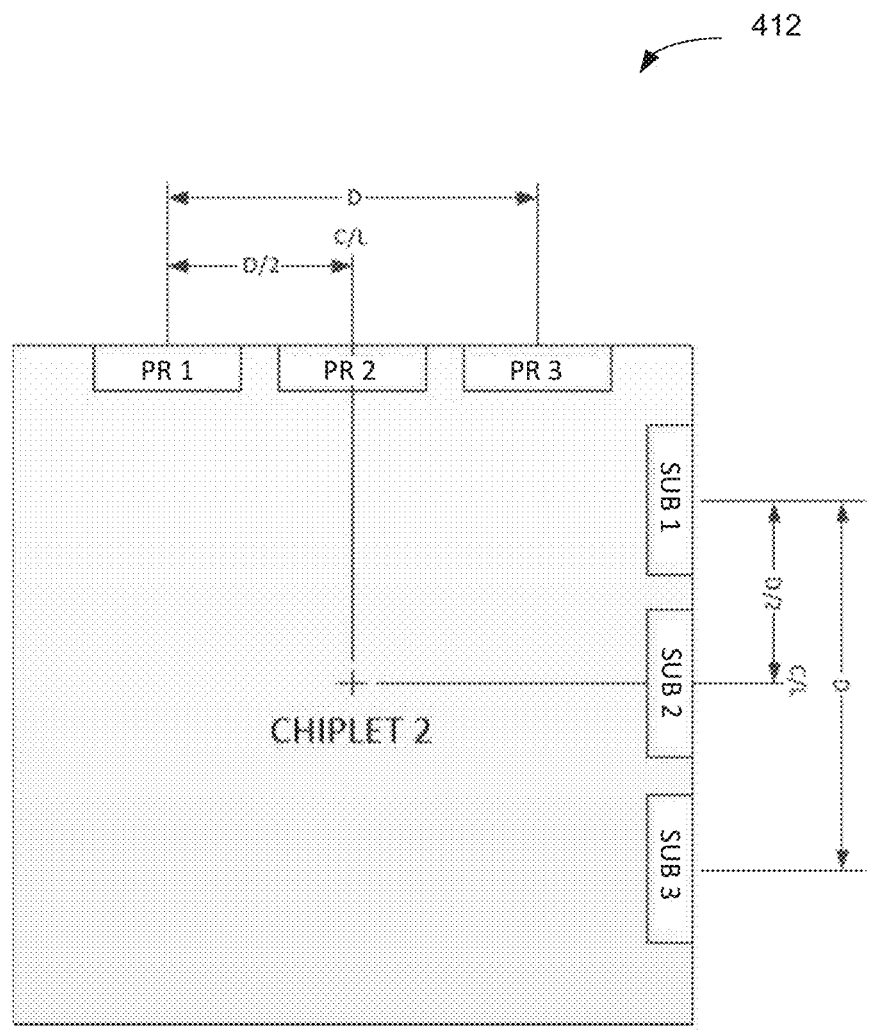
FIG. 4 is an illustration of an example of a chiplet, in accordance with some examples described herein.

FIG. 4 is an illustration representing an example of a chiplet 412 having an odd number (three) of blocks of I/O pads on a side. For chiplets with an odd number of blocks of I/O pads, a center block of I/O pads is aligned or centered on the centerline of the chiplet. For the remaining even number of I/O pad blocks, the blocks are placed as before with a block placed at a distance from the centerline of the chiplet equal to one-half of the total distance (D) between the corresponding block on the other side of the center block.

Figure 5:
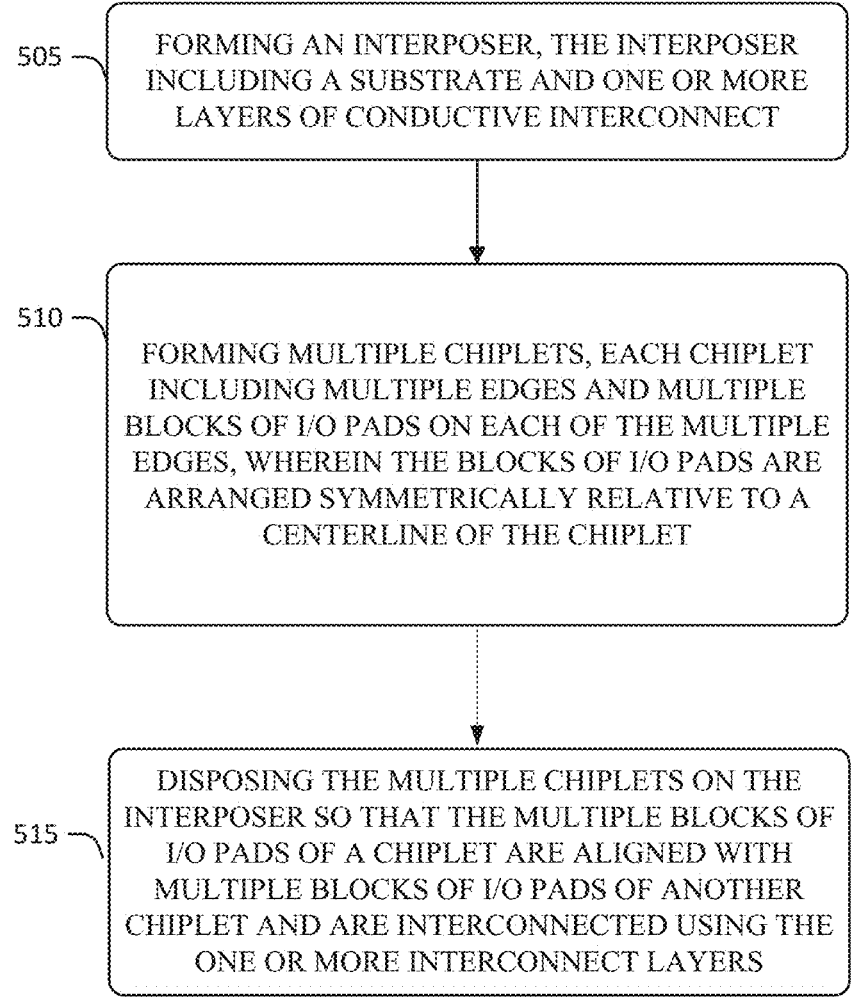
FIG. 5 is a flow diagram of an example of a method of making a chiplet system, in accordance with some examples described herein.

FIG. 5 is a flow diagram of an example of a method 500 of making a chiplet-based system. At 505, an interposer is formed. The interposer includes a substrate and one or more layers of conductive interconnect. The substrate may be a silicon substrate. The silicon substrate may be included in a chip-on-wafer-substrate package. The substrate may be an organic substrate.

The interposer provides the interconnection for the chiplets of the system. The conductive interconnect may have a pitch to accommodate connecting to I/O micro-bump blocks of the chiplets. The conductive interconnect of the substrate may include an EMIB. The conductive interconnect of the interposer may include a chiplet network. The conductive interconnect may include at least a portion of a network on chip (NOC).

At 510, multiple chiplets for the chiplet-based system are formed for mounting on the interposer. The chiplet system may be a memory device and the chiplets can include a memory controller chiplet and a memory device chiplet. Each of the chiplets includes multiple edges (e.g., four) or sides, and multiple blocks of I/O pads on each of the edges as shown in FIG. 3. The blocks of I/O pads may be I/O micro-bump blocks. The blocks of I/O pads are arranged on an edge of a chiplet at a distance from a centerline of the chiplet equal to one half of the distance between the blocks on an edge.

In some examples, each chiplet has an even number of blocks of I/O pads on an edge of the chiplet, and each of the blocks of I/O pads on the edge is placed a distance from a centerline of the chiplet equal to the one half of the distance between adjacent blocks of I/O pads of the chiplet. In some examples, each chiplet has an odd number of blocks of I/O pads on a side of the chiplet, including a center block of I/O pads. The center block of I/O pads is centered on the center line of the chiplet and the other blocks of I/O pads are placed at the distance from the centerline of the chiplet equal to one half of the distance between the other blocks of I/O pads.

At 515, the chiplets on the interposer are disposed so that the multiple blocks of I/O pads of a chiplet are aligned with multiple blocks of I/O pads of another chiplet and are interconnected using the one or more interconnect layers of the substrate. The placement of the blocks of I/O pads allows the chiplets to be properly aligned by being rotated so that the correct blocks of I/O pads line up facing each other at the edge of the chiplet. This allows for a closely-coupled interconnection among the chiplets to provide dense packaging to minimize the footprint of the chiplet system.

Figure 6:
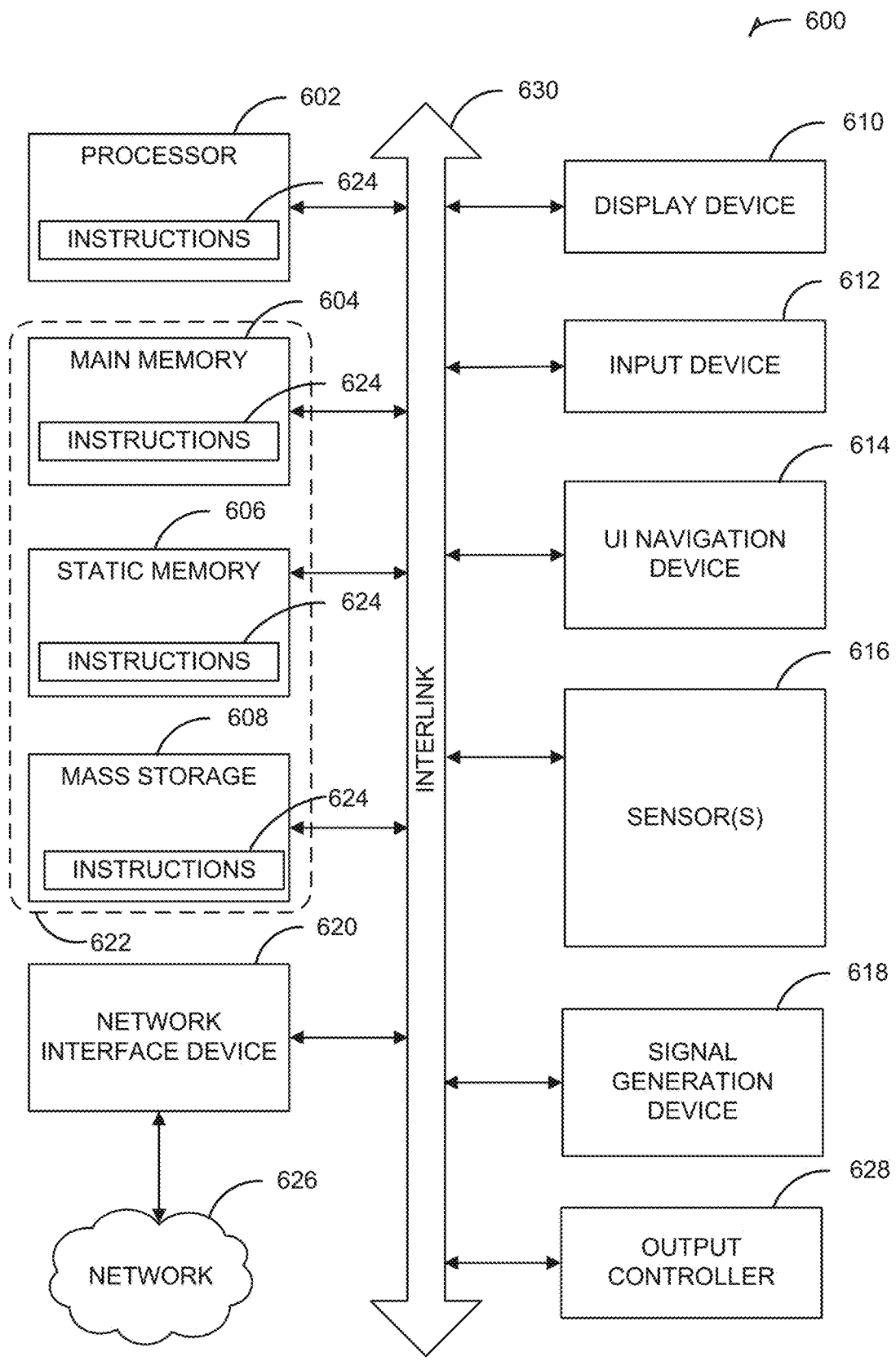
FIG. 6 is a block diagram of an example machine, in accordance with some examples described herein.

FIG. 6 illustrates a block diagram of an example machine 600 upon which any one or more of the techniques (e.g., methodologies) discussed herein may be implemented. Examples, as described herein, may include, or may operate by, logic or a number of components, or mechanisms in the machine 600. Circuitry (e.g., processing circuitry) is a collection of circuits implemented in tangible entities of the machine 600 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 600 follow.

In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 600 may include a hardware processor 602 (e.g., a central processing unit (CPU), a graphics processing unit (GPU), a hardware processor core, or any combination thereof), a main memory 604, a static memory (e.g., memory or storage for firmware, microcode, a basic-input-output (BI/OS), unified extensible firmware interface (UEFI), etc.) 606, and mass storage 608 (e.g., hard drives, tape drives, flash storage, or other block devices) some or all of which may communicate with each other via an interlink (e.g., bus) 630. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 602, the main memory 604, the static memory 606, or the mass storage 608 may be, or include, a machine readable medium 622 on which is stored one or more sets of data structures or instructions 624 (e.g., software) embodying or utilized by any one or more of the techniques or functions described herein. The instructions 624 may also reside, completely or at least partially, within any of registers of the processor 602, the main memory 604, the static memory 606, or the mass storage 608 during execution thereof by the machine 600. In an example, one or any combination of the hardware processor 602, the main memory 604, the static memory 606, or the mass storage 608 may constitute the machine-readable media 622. While the machine-readable medium 622 is illustrated as a single medium, the term "machine readable medium" may include a single medium or multiple media (e.g., a centralized or distributed database, and/or associated caches and servers) configured to store the one or more instructions 624.

The term "machine-readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 622 may be representative of the instructions 624, such as instructions 624 themselves or a format from which the instructions 624 may be derived. This format from which the instructions 624 may be derived may include source code, encoded instructions (e.g., in compressed or encrypted form), packaged instructions (e.g., split into multiple packages), or the like. The information representative of the instructions 624 in the machine readable medium 622 may be processed by processing circuitry into the instructions to implement any of the operations discussed herein. For example, deriving the instructions 624 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 624.

In an example, the derivation of the instructions 624 may include assembly, compilation, or interpretation of the information (e.g., by the processing circuitry) to create the instructions 624 from some intermediate or preprocessed format provided by the machine readable medium 622. The information, when provided in multiple parts, may be combined, unpacked, and modified to create the instructions 624. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 624 may be further transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®. IEEE 802.16 family of standards known as WiMax®). IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. A transmission medium is a machine readable medium.

In the foregoing specification, some example implementations of the disclosure have been described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of examples of implementations of the present disclosure.

Example 1 includes subject matter (such as a chiplet-based system) comprising a substrate including conductive interconnect, and multiple chiplets arranged on the interposer and interconnected using the conductive interconnect of the substrate. A chiplet includes multiple columns of multiple input-output (I/O) channels and the I/O channels are connected to a block of I/O pads and each side of the chiplet includes multiple blocks of the I/O pads. The multiple blocks of I/O pads on the side of the chiplet are arranged symmetrically relative to a centerline of the chiplet and each block of I/O pads on the side of the chiplet is at a common distance from any adjacent block of I/O pads on the side.

In Example 2, the subject matter of Example 1 optionally includes each block of I/O pads on the side of the chiplet is placed at a periphery of the chiplet at a distance from a centerline of the chiplet equal to one half of the distance between the multiple blocks of the I/O pads on a side.

In Example 3, the subject matter of one or both of Examples 1 and 2 optionally includes each chiplet including an even number of blocks of I/O pads on a side of the chiplet, and each of the blocks of I/O pads is placed at a periphery of the chiplet at a distance from a centerline of the chiplet equal to the one half of the distance between adjacent blocks of I/O pads.

In Example 4, the subject matter of one or any combination of Examples 1-3 optionally includes each chiplet including an odd number of blocks of I/O pads on a side of the chiplet, including a center block of I/O pads; and wherein the center block of I/O pads is centered on a center line of the chiplet and the other blocks of I/O pads are placed at the distance from the centerline of the chiplet equal to one half of the distance between the other blocks of I/O pads.

In Example 5, the subject matter of one or any combination of Examples 1-4 optionally includes multiple blocks of I/O pads that are multiple blocks of micro-bumps on the chiplet.

In Example 6, the subject matter of one or any combination of Example 1-5 optionally includes a first chiplet having a first block of multiple I/O pads that includes a principal die-to-die physical layer interface including one or more pads to transmit a data transfer clock, and a second chiplet having a second block of multiple I/O that includes a subordinate die-to-die physical layer interface including one or more pads to receive the data transfer clock, the second block of I/O pads connected to the first block of I/O pads by a die-to-die physical layer interconnect.

In Example 7, the subject matter of one or any combination of Examples 1-6 optionally includes a third chiplet having a third block of multiple I/O pads that includes another principal die-to-die physical layer interface, and the first chiplet having a fourth block of multiple I/O pads that includes another subordinate die-to-die physical layer interface that is connected to the principal die-to-die physical layer interface of the third chiplet by the die-to-die physical layer interconnect.

In Example 8, the subject matter of one or any combination of Examples 1-7 optionally includes a substrate that includes an interposer included in a chip on wafer silicon substrate package.

In Example 9, the subject matter of one or any combination of Examples 1-8 optionally a substrate that includes an interposer that includes an embedded multi-die interconnect bridge (EMIB).

In Example 10, the subject matter of one or any combination of Examples 1-7 optionally includes a substrate that is an organic substrate.

In Example 11, the subject matter of one or any combination of Examples 1-10 optionally includes the multiple chiplets arranged on the interposer including a memory controller chiplet and a memory device chiplet.

In Example 12, the subject matter of one or any combination of Examples 1-11 optionally includes the conductive interconnect of the interposer includes a chiplet mesh network.

Example 13 can include subject matter (such as a method of making a chiplet system) or can optionally be combined with one or any combination of Examples 1-12 to include such subject matter, comprising forming an interposer, the interposer including a substrate and one or more layers of conductive interconnect; forming multiple chiplets, each chiplet including multiple edges and multiple blocks of input/output (I/O) pads on each of the multiple edges, wherein the multiple blocks of I/O pads on an edge of the chiplet are arranged symmetrically relative to a centerline of the chiplet and each block of I/O pads on the edge of the chiplet is at a common distance from any adjacent block of I/O pads on the edge; and disposing the multiple chiplets on the interposer so that the multiple blocks of I/O pads of a chiplet are aligned with multiple blocks of I/O pads of another chiplet and are interconnected using the one or more layers of conductive interconnect.

In Example 14, the subject matter of Example 13 optionally includes a block of I/O pads is arranged on its corresponding edge of the chiplet at a distance from the centerline of the chiplet equal to one half of the distance between the multiple blocks of I/O pads on the corresponding edge.

In Example 15, the subject matter of one or both of Examples 13 and 14 optionally includes forming a chiplet to have an even number of blocks of I/O pads on an edge of the chiplet, and each of the blocks of I/O pads on the edge is placed a distance from the centerline of the chiplet equal to the one half of the distance between adjacent blocks of I/O pads.

In Example 16, the subject matter of one or any combination of Examples 13-15 optionally includes forming a chiplet to have an odd number of blocks of I/O pads on a side of the chiplet, including a center block of I/O pads; and wherein the center block of I/O pads is centered on the center line of the chiplet and the other blocks of I/O pads are placed at the distance from the centerline of the chiplet equal to one half of the distance between the other blocks of I/O pads.

In Example 17, the subject matter of one or any combination of Examples 13-16 optionally includes forming an interposer to include a chiplet mesh network in the interconnect of the interposer.

In Example 18, the subject matter of one or any combination of Examples 13-17 optionally includes forming a memory controller chiplet and a memory device chiplet, and arranging the memory controller chiplet and the memory device chiplet on the interposer.

In Example 19, the subject matter of one or any combination of Examples 13-18 optionally includes forming an interposer that as a silicon substrate included in a chip on wafer silicon substrate package.

In Example 20, the subject matter of one or any combination of Examples 13-20 optionally includes forming an interposer that includes an embedded multi-die interconnect bridge (EMIB).

In Example 21, the subject matter of one or any combination of Examples 13-18 optionally includes forming an interposer that includes an organic substrate.

Example 22 includes subject matter (such as a memory device) or can optionally by combined with one or any combination of Examples 1-21 to include such subject matter, comprising an interposer including conductive interconnect; and multiple chiplets arranged on the interposer and interconnected, the multiple chiplets including a memory controller chiplet, wherein the memory controller chiplet and another chiplet include a chiplet network interface (CPI). The memory controller chiplet includes multiple columns of multiple input-output (I/O) channels and the columns of the I/O channels are connected to I/O micro-bump blocks and each side of the chiplet includes multiple I/O micro-bump blocks. An I/O micro-bump block is placed at a periphery of the chiplet at a distance from a centerline of the chiplet equal to one half of the distance between I/O micro-bump blocks on a side of the chiplet.

In Example 23, the subject matter of Example 22 optionally includes a side of the memory controller chiplet includes an even number of advanced interface bus (AIB) channels connected to an even number of 10 micro-bump blocks, and the I/O micro-bump blocks are placed at the periphery of the memory controller chiplet at a distance from a centerline of the memory controller chiplet equal to the one half of the distance between adjacent I/O micro-bump blocks; and a facing side of the other chiplet includes an even number of AIB channels connected to an even number of I/O micro-bumps aligned with the micro-bump blocks of the memory controller chiplet.

In Example 24, the subject matter of one or both of Examples 22 and 23 optionally includes aa side of the memory controller chiplet includes an odd number of advanced interface bus (AIB) channels connected to an odd number of I/O micro-bump blocks including a center I/O micro-bump block, and the center I/O micro-bump block is centered on the center line of the memory controller chiplet and the other I/O micro-bump blocks are placed at are distance from the centerline of the chiplet equal to one half of the distance between the other I/O micro-bump blocks; and a facing side of the other chiplet includes an odd number of AIB channels connected to an odd number of I/O micro-bumps aligned with the I/O micro-bump blocks of the memory controller chiplet.

These non-limiting Examples can be combined in any permutation or combination.

What is claimed is:

1. A system comprising:
    a substrate including conductive interconnect;
    multiple chiplets arranged on the substrate and interconnected using the conductive interconnect of the substrate;
    wherein a chiplet includes multiple columns of multiple input-output (I/O) channels and the I/O channels are connected to a block of I/O pads and each side of the chiplet includes multiple blocks of the I/O pads including a first side of the chiplet and an adjacent side of the chiplet adjacent to the first side;
    wherein the multiple blocks of I/O pads on the side of the chiplet are arranged symmetrically relative to a centerline of the chiplet and each block of I/O pads on the side of the chiplet is at a common distance from any adjacent block of I/O pads on the side; and
    wherein the multiple blocks of I/O pads of the first side of the chiplet are each attached to a principal I/O channel, and the multiple blocks of I/O pads of the adjacent side are each attached to a subordinate I/O channel.

2. The system of claim 1, wherein each block of I/O pads on the side of the chiplet is placed at a periphery of the chiplet at a distance from a centerline of the chiplet equal to one half of the distance between the multiple blocks of the I/O pads on a side.

3. The system of claim 1, wherein each chiplet includes an even number of blocks of I/O pads on a side of the chiplet, and each of the blocks of I/O pads is placed at a periphery of the chiplet at a distance from a centerline of the chiplet equal to the one half of the distance between adjacent blocks of I/O pads.

4. The system of claim 1, wherein each chiplet includes an odd number of blocks of I/O pads on a side of the chiplet, including a center block of I/O pads; and wherein the center block of I/O pads is centered on a center line of the chiplet and the other blocks of I/O pads are placed at the distance from the centerline of the chiplet equal to one half of the distance between the other blocks of I/O pads.

5. The system of claim 1, wherein the multiple blocks of I/O pads are multiple blocks of micro-bumps on the chiplet.

6. The system of claim 1, including:
- a first chiplet having a first block of multiple I/O pads that includes a principal die-to-die physical layer interface including one or more pads to transmit a data transfer clock; and
- a second chiplet having a second block of multiple I/O that includes a subordinate die-to-die physical layer interface including one or more pads to receive the data transfer clock, the second block of I/O pads connected to the first block of I/O pads by a die-to-die physical layer interconnect.

7. The system of claim 6, including:
- a third chiplet having a third block of multiple I/O pads that includes another principal die-to-die physical layer interface; and
- wherein the first chiplet has a fourth block of multiple I/O pads that includes another subordinate die-to-die physical layer interface that is connected to the principal die-to-die physical layer interface of the third chiplet by the die-to-die physical layer interconnect.

8. The system of claim 1, wherein the substrate includes an interposer included in a chip on wafer silicon substrate package.

9. The system of claim 1, wherein the substrate includes an interposer that includes an embedded multi-die interconnect bridge (EMIB).

10. The system of claim 1, wherein the substrate is an organic substrate.

11. The system of claim 1, wherein the multiple chiplets arranged on the interposer include a memory controller chiplet and a memory device chiplet.

12. The system of claim 1, wherein the interconnect of the interposer includes a chiplet mesh network.

13. A memory device including:
- an interposer including conductive interconnect;
- multiple chiplets arranged on the interposer and interconnected, the multiple chiplets including a memory controller chiplet, wherein the memory controller chiplet and another chiplet include a chiplet network interface (CPI);
- wherein the memory controller chiplet includes multiple columns of multiple input-output (I/O) channels and the columns of the I/O channels are connected to I/O micro-bump blocks and each side of the chiplet includes multiple I/O micro-bump blocks including a first side of the chiplet and an adjacent side of the chiplet adjacent to the first side, wherein the multiple blocks of I/O pads of the first side of the chiplet are each attached to a principal I/O channel and the multiple blocks of I/O pads of the adjacent side are each attached to a subordinate I/O channel; and
- wherein an I/O micro-bump block is placed at a periphery of the chiplet at a distance from a centerline of the chiplet equal to one half of the distance between I/O micro-bump blocks on a side of the chiplet.

14. The memory device of claim 13,
- wherein a side of the memory controller chiplet includes an even number of advanced interface bus (AIB) channels connected to an even number of I/O micro-bump blocks, and the I/O micro-bump blocks are placed at the periphery of the memory controller chiplet at a distance from a centerline of the memory controller chiplet equal to the one half of the distance between adjacent I/O micro-bump blocks; and
- wherein a facing side of the other chiplet includes an even number of AIB channels connected to an even number of I/O micro-bumps aligned with the micro-bump blocks of the memory controller chiplet.

15. The memory device of claim 13,
- wherein a side of the memory controller chiplet includes an odd number of advanced interface bus (AIB) channels connected to an odd number of I/O micro-bump blocks including a center I/O micro-bump block, and the center I/O micro-bump block is centered on the center line of the memory controller chiplet and the other I/O micro-bump blocks are placed at are distance from the centerline of the chiplet equal to one half of the distance between the other I/O micro-bump blocks; and
- wherein a facing side of the other chiplet includes an odd number of AIB channels connected to an odd number of I/O micro-bumps aligned with the I/O micro-bump blocks of the memory controller chiplet.

* * * * *